(12) United States Patent
Wang et al.

(10) Patent No.: US 10,305,227 B2
(45) Date of Patent: May 28, 2019

(54) ELECTRICAL RECEPTACLE CONNECTOR INCLUDING A BAFFLE PLATE

(71) Applicant: ADVANCED-CONNECTEK INC., New Taipei (TW)

(72) Inventors: Yao-Te Wang, New Taipei (TW); Ruei-Si Hong, New Taipei (TW)

(73) Assignee: ADVANCED-CONNECTEK INC., New Taipei (TW)

( * ) Notice: Subject to any disclaimer, the term of this patent is extended or adjusted under 35 U.S.C. 154(b) by 4 days.

(21) Appl. No.: 15/840,240

(22) Filed: Dec. 13, 2017

(65) Prior Publication Data

US 2019/0097361 A1 Mar. 28, 2019

(30) Foreign Application Priority Data

Jan. 9, 2017 (TW) .............................. 106200365 U

(51) Int. Cl.

| | |
|---|---|
| *H01R 24/60* | (2011.01) |
| *H01R 13/6596* | (2011.01) |
| *H05K 5/04* | (2006.01) |
| *H01R 13/6471* | (2011.01) |
| *H01R 13/6585* | (2011.01) |
| *H01R 13/516* | (2006.01) |
| *H01R 107/00* | (2006.01) |
| *H01R 12/72* | (2011.01) |

(Continued)

(52) U.S. Cl.

CPC ..... *H01R 13/6596* (2013.01); *H01R 13/6471* (2013.01); *H01R 13/6585* (2013.01); *H01R 24/60* (2013.01); *H05K 5/04* (2013.01); *H01R 12/722* (2013.01); *H01R 12/724* (2013.01); *H01R 13/516* (2013.01); *H01R 13/6466* (2013.01); *H01R 13/6587* (2013.01); *H01R 13/6594* (2013.01); *H01R 24/64* (2013.01); *H01R 2107/00* (2013.01)

(58) Field of Classification Search

CPC .............. H01R 12/724; H01R 23/7073; H01R 13/6587; H01R 13/6594; H01R 23/6873; H01R 23/02; H01R 24/60; H01R 24/62; H01R 13/6466; H01R 24/64
USPC ................................ 439/660, 676, 607.4, 79
See application file for complete search history.

(56) References Cited

U.S. PATENT DOCUMENTS

| | | | | |
|---|---|---|---|---|
| 2009/0298336 A1* | 12/2009 | Xiong | ................... | H01R 13/648 439/607.01 |
| 2015/0162714 A1* | 6/2015 | Yu | .......................... | H01R 24/62 439/660 |
| 2015/0229077 A1* | 8/2015 | Little | ................... | H01R 12/724 439/78 |

\* cited by examiner

*Primary Examiner* — Abdullah A Riyami
*Assistant Examiner* — Justin M Kratt
(74) *Attorney, Agent, or Firm* — Muncy, Geissler, Olds & Lowe, P.C.

(57) ABSTRACT

An electrical receptacle connector includes a metallic shell, a terminal module in the metallic shell, a baffle plate at a rear portion of the metallic shell, and conductive ground legs. Accordingly, the baffle plate is at the rear portion of the metallic shell, and the conductive ground legs are at two sides of the metallic shell. Therefore, during the connector transmits data, the produced noises are shielded by the baffle plate, and the current formed by the noises is guided to a circuit board through the conductive ground legs, thus the noises are grounded and diminished. The conductive ground legs are adjacent to the baffle plate. Hence, the current flowing through the baffle plate is guided to the circuit board through the conductive ground legs, with a shorter path. Therefore, the current would not have antenna effect easily on the path, and the noise spreading can be reduced.

12 Claims, 10 Drawing Sheets

(51) Int. Cl.
*H01R 13/6594* (2011.01)
*H01R 13/6466* (2011.01)
*H01R 13/6587* (2011.01)
*H01R 24/64* (2011.01)

ELECTRICAL RECEPTACLE CONNECTOR INCLUDING A BAFFLE PLATE

CROSS-REFERENCE TO RELATED APPLICATION

This non-provisional application claims priority under 35 U.S.C. § 119(a) to Patent Application 106200365 in Taiwan, R.O.C. on Jan. 9, 2017, the entire contents of which are hereby incorporated by reference.

FIELD OF THE INVENTION

The instant disclosure relates to an electrical connector, and more particular to an electrical receptacle connector.

BACKGROUND

Nowadays, electronic devices generate more electromagnetic waves as they are becoming more multifunctional. However, the more electromagnetic waves the devices generate, the worse radiofrequency interference (RFI) affects the operation or the signal transmission between devices.

Existing USB 3.0 electrical receptacle connectors produce noise during data transmission. A conventional USB 3.0 electrical receptacle connector is assembled to a crack at one side of a circuit board by a sinking technique. In addition, a shielding iron sheet is assembled at a rear portion of a metallic shell of the connector for shielding the noise from spreading.

When the noise is shielded by the shielding iron sheet, the noise further forms an electrical current, and the current has to be grounded to the circuit board by the legs at two sides of the metallic shell. Nevertheless, because the legs are distant from the shielding iron sheet and not in contact with the shielding iron sheet, the current flowing through the shielding iron sheet has to be guided to the rear of the metallic shell and then further guided to the legs from the rear of the metallic shell.

As a result, the current (i.e., the noise current) has to be transmitted with over a longer distance for grounding, and the noise current would have an antenna effect on the transmission path thus spreading the noise and affecting the operation of an electronic device connected to the connector. For example, the signal transmission of a USB 3.0 connector on a laptop affects the operation of a wireless mouse with 2.4 G transmission speed connected to the same laptop. In this situation, the reaction of the mouse lags behind the user's operation.

SUMMARY OF THE INVENTION

In view of this, an embodiment of the instant disclosure provides an electrical receptacle connector. The electrical receptacle connector comprises a metallic shell, a terminal module, a baffle plate, and a plurality of conductive ground legs. The metallic shell comprises a receptacle cavity, a front end at a front portion of the receptacle cavity, and a rear end at a rear portion of the receptacle cavity. The terminal module is in the receptacle cavity. The terminal module comprises a base portion at the rear end, a tongue portion outwardly extended from one side of the base portion toward the front end, and a plurality of first and second terminals at the base portion. One of the two ends of each of the first terminals and one of the two ends of each of the second terminals are exposed from a surface of the tongue portion, and the other end of each of the first terminals and the other end of each of the second terminals protrude out of the base portion. The baffle plate is at the rear end. The baffle plate comprises a main body and two sidewalls. The main body is flush with a rear lateral surface of the base portion and in contact with a rear periphery of the metallic shell. The two sidewalls respectively extend from two sides of the main body toward two outer surfaces of two sides of the metallic shell. The conductive ground legs are adjacent to two sides of the rear portion of the metallic shell and respectively correspond to the sidewalls. Each of the conductive ground legs comprises a connection portion and an extension portion. The connection portions are respectively in contact with the sidewalls. Each of the extension portions extends outward from the corresponding connection portion.

In one embodiment, each of the conductive ground legs and the baffle plate are an integral part, and each of the conductive ground legs extends outwardly from an edge of the corresponding sidewall.

In one embodiment, each of the conductive ground legs comprises an insertion leg. Each of the insertion legs extends outwardly from an edge of the corresponding extension portion.

In one embodiment, the baffle plate comprises a plurality of protruding blocks. The protruding blocks are respectively formed on inner surfaces of the sidewalls. A plurality of engaging grooves is respectively formed on the two outer surfaces of the metallic shell for being engaged with the protruding blocks.

In one embodiment, a plurality of extension legs extends outwardly from the two sides of the metallic shell. The extension legs are soldered to contact pads of a circuit board.

In one embodiment, the baffle plate comprises a plurality of bending sheets. The bending sheets are formed at the two sides of the main body and are engaged with the rear periphery of the metallic shell.

In one embodiment, each of the conductive ground legs and the metallic shell are an integral part, and the conductive ground legs extend outwardly from two sides of the rear portion of the metallic shell.

In one embodiment, two recessed holes are formed on the two sides of the rear portion of the metallic shell, and the two sidewalls are at bottom portions of the conductive ground legs to shield the two recessed holes, respectively.

In one embodiment, a terminal organizer is at the rear portion of the base portion and extends outwardly and a soldering region is at a bottom portion of the terminal organizer. The other end of each of the first terminals and the other end of each of the second terminals protrude out of the bottom portion of the terminal organizer.

In one embodiment, each of the first terminals is held in the base portion and the tongue portion and disposed at an upper surface of the tongue portion. Each of the second terminals is held in the base portion and the tongue portion and disposed at the upper surface of the tongue portion. The one of two ends of each of the second terminals is in front of the one of two ends of each of the first terminals.

As above, the baffle plate is at the rear portion of the metallic shell, and the conductive ground legs are at two sides of the metallic shell. Therefore, when the electrical receptacle connector transmits data, the noise produced by the data is shielded by the baffle plate, and the noise current formed by the noise is guided to the circuit board through the conductive ground legs which are in contact with the circuit board, thus the noise is grounded and diminished. The conductive ground legs are adjacent to the baffle plate. That is, the conductive ground legs are at the two sides of the rear portion of the metallic shell and in contact with the sidewalls of the baffle plate. Hence, the current flowing through the baffle plate is guided to the circuit board through the conductive ground legs, which has a shorter current path. Therefore, the noise current would not have an antenna effect easily on the transmission path. Accordingly, the noise spreading can be reduced, and the problems of the electromagnetic interference (EMI) and the radiofrequency interference (RFI) can be improved.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
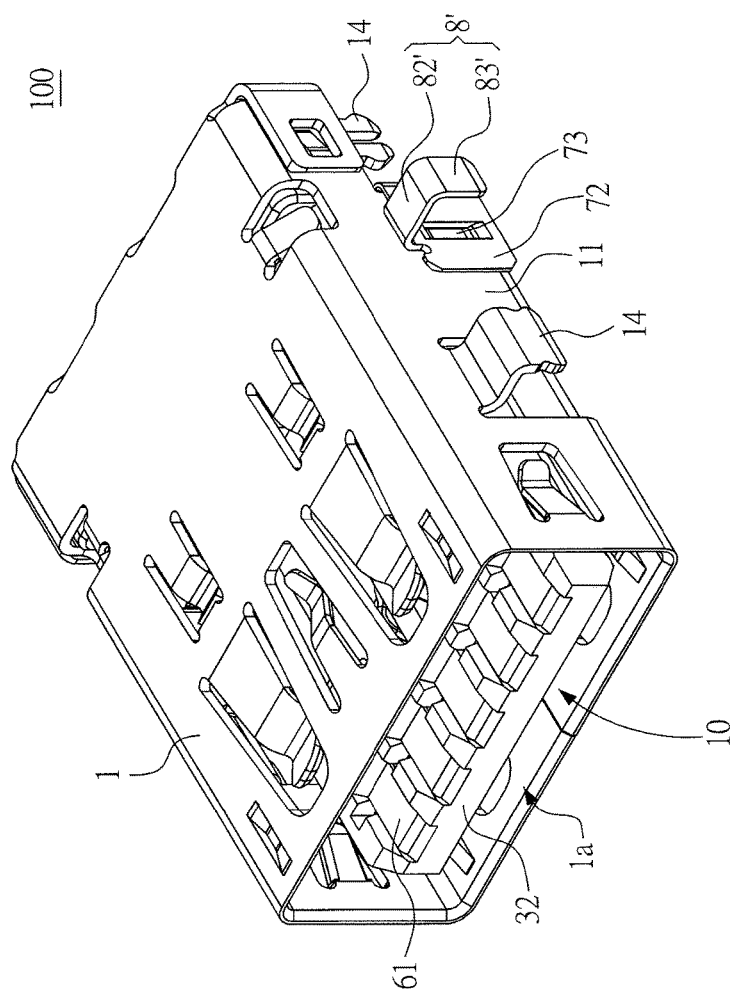
FIG. 1 illustrates a perspective view of an electrical receptacle connector of a first embodiment of the instant disclosure.
Figure 2:
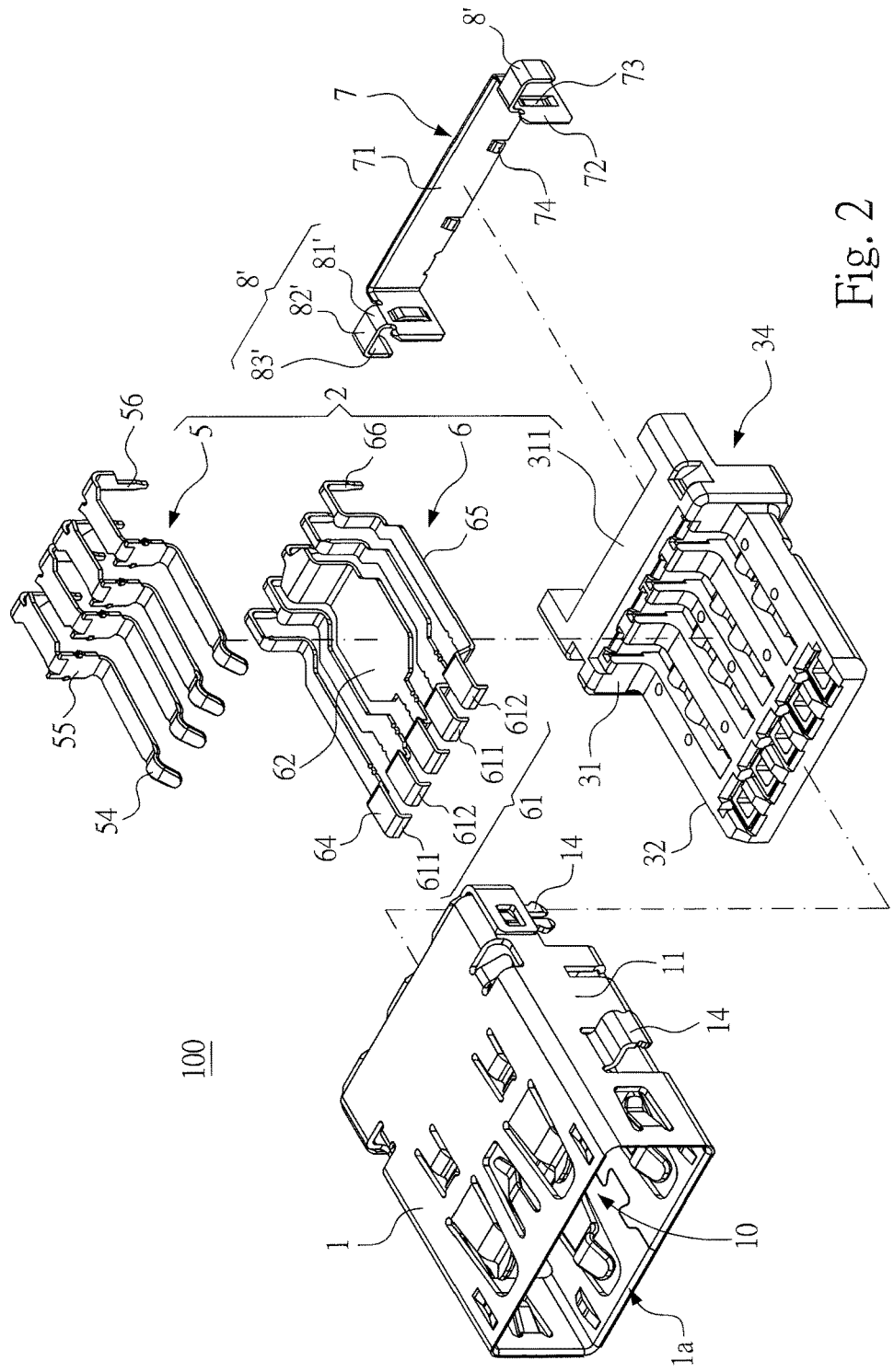
FIG. 2 illustrates an exploded view of the electrical receptacle connector of the first embodiment.

Please refer to FIGS. 1 and 2, illustrating an electrical receptacle connector 100 of a first embodiment of the instant disclosure. FIG. 1 illustrates a perspective view of an electrical receptacle connector 100 of the first embodiment of the instant disclosure. FIG. 2 illustrates an exploded view of the electrical receptacle connector 100 of the first embodiment. In this embodiment, the electrical receptacle connector 100 may be a connector having USB 3.0 or 3.1 interfaces. In this embodiment, the electrical receptacle connector 100 comprises a metallic shell 1, a terminal module 2, a baffle plate 7, and a plurality of conductive ground legs 8'.

Figure 3:
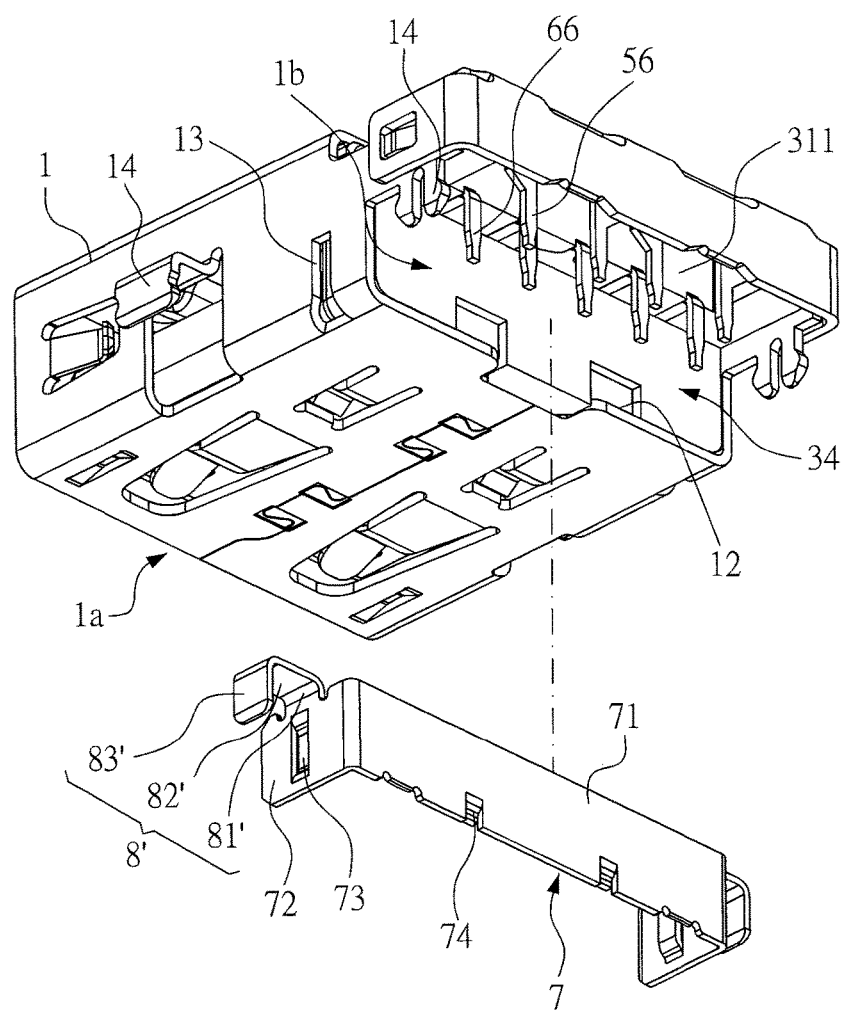
FIG. 3 illustrates a schematic exploded view showing a metallic shell of the connector is to be assembled with a baffle plate, according to the first embodiment.
Figure 5:
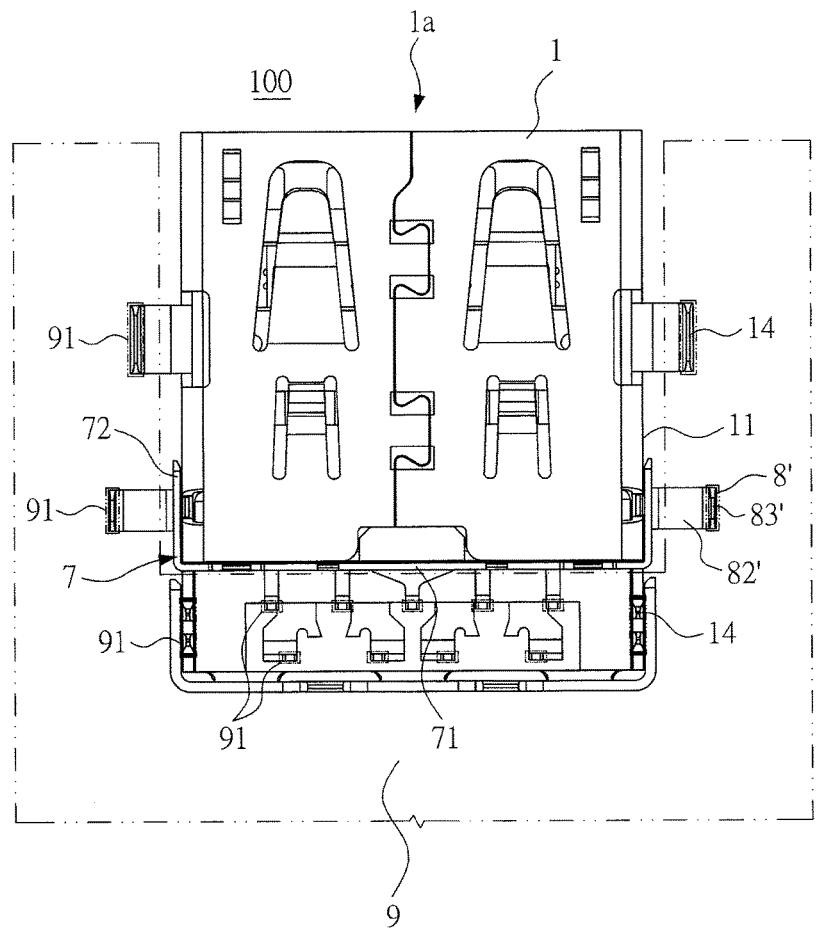
FIG. 5 illustrates a top view of the electrical receptacle connector of the first embodiment.
Figure 6:
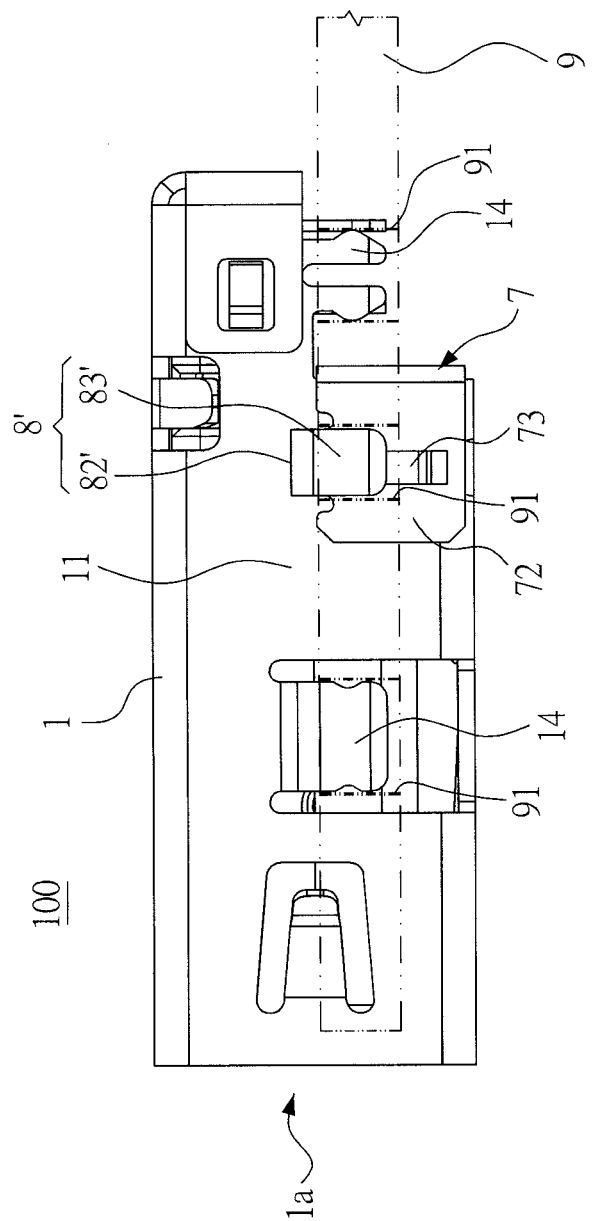
FIG. 6 illustrates a lateral view of the electrical receptacle connector of the first embodiment.

Please refer to FIGS. 2, 3, 5, and 6. FIG. 3 illustrates a schematic exploded view showing a metallic shell of the connector is to be assembled with a baffle plate, according to the first embodiment. FIG. 5 illustrates a top view of the electrical receptacle connector of the first embodiment. FIG. 6 illustrates a lateral view of the electrical receptacle connector of the first embodiment. In this embodiment, the metallic shell 1 is a hollowed shell. The metallic shell 1 comprises a receptacle cavity 10, and the terminal module 2 is in the receptacle cavity 10 so that the metallic shell 1 encloses the terminal module 2. A front portion and a rear portion of the metallic shell 1 are hollowed, so that a user can see the terminal module 2 through the hollowed portions of the metallic shell 1. Moreover, the metallic shell 1 comprises a front end 1a at a front portion of the receptacle cavity 10 and a rear end 1b at a rear portion of the receptacle cavity 10 (as shown in FIG. 3). The front end 1a is for the insertion of an electrical plug connector, and the rear end 1b is for soldering with a circuit board 9 by a sinking technique. That is, a crack is formed at one side of the circuit board 9 (as shown in FIG. 5). The metallic shell 1 is assembled with the circuit board 9 and positioned in the crack. Furthermore, a plurality of extension legs 14 extends outwardly from two sides of the metallic shell 1. The extension legs 14 are soldered with contact pads 91 of the circuit board 9.

Please refer to FIGS. 2, 3, 5, and 6. In this embodiment, the terminal module 2 is in the receptacle cavity 10. The terminal module 2 comprises a base portion 31, a tongue portion 32, a plurality of first terminals 5, and a plurality of second terminals 6. The base portion 31 is at the rear end 1b. The tongue portion 32 outwardly extends from one side of the base portion 31 toward the front end 1a.

Please refer to FIGS. 2, 3, 5, 6. In this embodiment, a terminal organizer 311 is at the rear portion of the base portion 31 and extends outwardly, and a soldering region 34 is at a bottom portion of the terminal organizer 311. The terminal organizer 311 is disposed above the circuit board 9, and an edge portion of the circuit board 9 is disposed at the soldering region 34.

Please refer to FIGS. 1, 2, 5, and 6. In this embodiment, each of the first terminals 5 is held in the base portion 31 and the tongue portion 32 and disposed at an upper surface of the tongue portion 32, and each of the second terminals 6 is held in the base portion 31 and the tongue portion 32 and disposed at the upper surface of the tongue portion 32. One of the two ends of each of the second terminals 6 is aligned in front of one of the two ends of each of the first terminals 5, and the other end of each of the first terminals 5 and the other end of each of the second terminals 6 protrude out of the bottom of the terminal organizer 311 and are in contact with the contact pads 91 of the circuit board 9, respectively.

Figure 4:
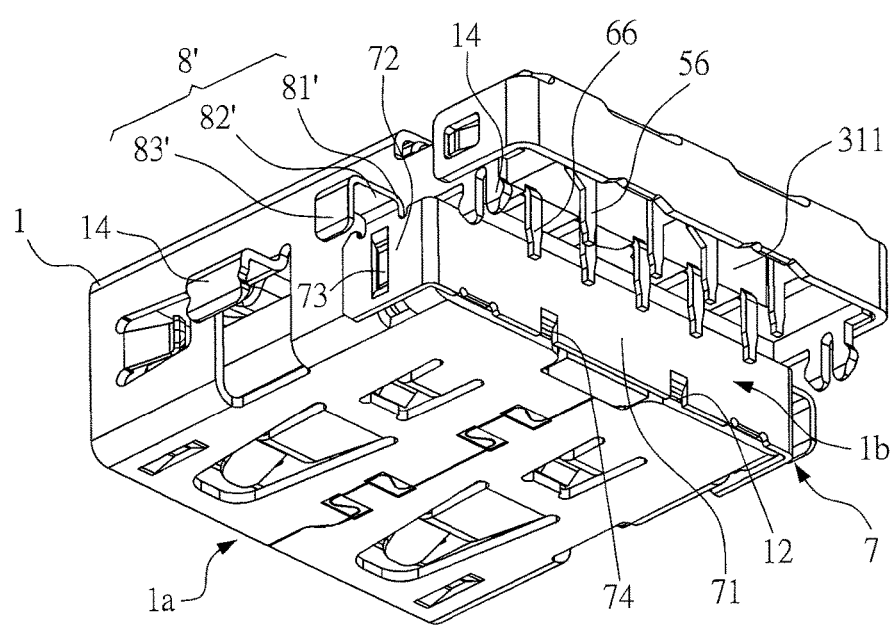
FIG. 4 illustrates a schematic perspective view showing the metallic shell of the connector is assembled with the baffle plate, according to the first embodiment.

Please refer to FIGS. 2 to 4. FIG. 4 illustrates a schematic perspective view showing the metallic shell of the connector is assembled with the baffle plate, according to the first embodiment. In this embodiment, the baffle plate 7 is at the rear end 1b. The baffle plate 7 comprises a main body 71 and two sidewalls 72. The main body 71 is flush with a rear lateral surface of the base portion 31 and in contact with a rear periphery 12 of the metallic shell 1. The two sidewalls 72 respectively extend from two sides of the main body 71 toward two outer surfaces 11 of two sides of the metallic shell 1. In this embodiment, the main body 71 is an elongated plate, and the main body 71 and the two sidewalls 72 are reverse U shaped in a top view. When the first terminals 5 and the second terminals 6 transmit data, the main body 71 receives the noise produced by the data, and the main body 71 also shields the noise to reduce the spreading of the noise toward the rear portion of the metallic shell 1.

Please refer to FIGS. 2 to 4. In this embodiment, the baffle plate 7 comprises a plurality of protruding blocks 73. The protruding blocks 73 are respectively formed on inner surfaces of the side walls 72. A plurality of engaging grooves 13 is respectively formed on the two outer surfaces 11 of the metallic shell 1 for being engaged with the protruding blocks 73. Accordingly, when the baffle plate 7 is assembled to the rear portion of the metallic shell 1 in a bottom-to-top direction, the protruding blocks 73 are engaged with the engaging grooves 13, so that back-and-forth movement of the baffle plate 7 at the rear portion of the metallic shell 1 is limited.

Please refer to FIGS. 2 to 4. In this embodiment, the baffle plate 7 comprises a plurality of bending sheets 74. The bending sheets 74 are formed at the two sides of the main body 71 and engaged with the rear periphery 12 of the metallic shell 1. Accordingly, when the baffle plate 7 is assembled to the rear portion of the metallic shell 1 in a bottom-to-top direction, the bending sheets 74 are engaged with the lower surface of the rear periphery 12 of the metallic shell 1, so that up-and-down movement of the baffle plate 7 at the rear portion of the metallic shell 1 is limited.

Please refer to FIGS. 2, 3, 5, and 6. In this embodiment, the conductive ground legs 8' are adjacent to two sides of the rear portion of the metallic shell 1 and respectively correspond to the sidewalls 72. Each of the conductive ground legs 8' comprises a connection portion 81' and an extension portion 82'. The connection portions 81' are respectively in contact with the sidewalls 72. Each of the extension portions 82' extends outwardly from the corresponding connection portion 81'. In this embodiment, the conductive ground legs 8' and the baffle plate 7 are an integral part, and each of the conductive ground legs 8' extends outwardly from an edge of a top portion of the corresponding sidewall 72. In addition, each of the conductive ground legs 8' further comprises an insertion leg 83', and each of the insertion legs 83' extends outwardly from an edge of the corresponding extension portion 82'. The insertion legs 83' extend vertically and downwardly to form vertical legs (legs manufactured by through-hole technologies) and are in contact with the contact pads 91 of the circuit board 9. In other words, the insertion legs 83' are inserted into soldering holes of the circuit board 9 for soldering.

After the noise is shielded by the main body 71 of the baffle plate 7, the noise forms an electrical current, the current is guided to the conductive ground legs 8' through the two sidewalls 72 of the baffle plate 7, and then the current is grounded and diminished, through the conductive ground legs 8', by in contact with the circuit board 9. In this embodiment, the conductive ground legs 8' are adjacent to the baffle plate 7. That is, the conductive ground legs 8' are formed integrally with the sidewalls 72 of the baffle plate 7, respectively, for directly transmitting the currents, and the conductive ground legs 8' are at two sides of the rear portion of the metallic shell 1, so that the current flowing through the baffle plate 7 is guided to the circuit board 9 through the conductive ground legs 8' on the sidewalls 72.

Please refer to FIG. 2. In this embodiment, the base portion 31 and the tongue portion 32 are injection molded. The tongue portion 32 extends from one end of the base portion 31. A plurality of terminal grooves is formed on the upper surface of the tongue portion 32 and extends along the tongue portion 32.

Please refer to FIGS. 2, 3, 5, and 6. The first terminals 5 are flexible terminals of USB 2.0 interface. The first terminals 5 are arranged in a horizontal line, and the number of the first terminals 5 may be four. The first terminals 5 are respectively in the terminal grooves. Each of the first terminals 5 comprises a flexible contact portion 54, a body portion 55, and a tail portion 56. For each of the first terminals 5, the flexible contact portion 54 extends forwardly from the body portion 55 in the rear-to-front direction and is partly exposed upon the surface of the tongue portion 32 for contacting a corresponding terminal of a corresponding plug connector, and the tail portion 56 extends backwardly from the body portion 55 in the front-to-rear direction, protrudes out of the bottom portion of the terminal organizer 311, and is soldered to the circuit board 9. The flexible contact portion 54, the body portion 55, and the tail portion 56 are different portions of one first terminal 5. In this embodiment, the first terminals 5 are positioned in the respective terminal grooves by insert-molding technique.

Please refer to FIGS. 2, 3, 5, and 6. The second terminals 6 are flat terminals of USB 3.0 or USB 3.1 interfaces. The second terminals 6 are arranged in a horizontal line, and the number of the second terminals 6 may be five. The second terminals 6 are held in the base portion 31 and the tongue portion 32 and are disposed at the upper surface of the tongue portion 32, and the second terminals 6 are at the upper surface of the tongue portion 32 and aligned in front of the first terminals 5. In this embodiment, the second terminals 6 are assembled to the base portion 31 and the tongue portion 32 by insert-molding technique. In this embodiment, the second terminals 6 and the first terminals 5 conform to the specification of USB 3.0 and USB 3.1 interfaces standardized by the USBIF organization.

Please refer to FIGS. 2 and 5. The second terminals 6 comprise two signal terminals 61 and a ground terminal 62 between the two signal terminal pairs 61. Each of the second terminals 6 comprises a flat contact portion 64, a body portion 65, and a tail portion 66. For each of the second terminals 5, the flat contact portion 64 extends forwardly from the body portion 65 in the rear-to-front direction and is partly exposed upon the surface of the tongue portion 32 for contacting a corresponding terminal of a corresponding plug connector and the tail portion 66 extends backwardly from the body portion 65 in the front-to-rear direction and soldered to the circuit board 9. The flat contact portion 64, the body portion 65, and the tail portion 66 are different portions of one second terminal 6.

Please refer to FIG. 2. Each of the signal terminal pairs 61 comprises a positive signal terminal 611 and a negative signal terminal 612. In one embodiment, a first signal terminal pair 61 comprises a super-speed positive-signal transmitter differential terminal and a super-speed negative-signal transmitter differential terminal, and a second signal terminal pair 61 comprises a super-speed positive-signal receiver differential terminal and a super-speed negative-signal receiver differential terminal. The positive signal terminal 611 of the first signal terminal pair 61 is between the negative signal terminal 612 of the first signal terminal pair 61 and the ground terminal 62. The negative signal terminal 612 of the second signal terminal pair 61 is between the positive signal terminal 611 of the second signal terminal pair 61 and the ground terminal 62. In other words, two neighboring terminals at two sides of the ground terminal 62 are, respectively, the positive signal terminal 611 of the first signal terminal pair 61 and the negative signal terminal 612 of the second signal terminal pair 61.

Figure 7:
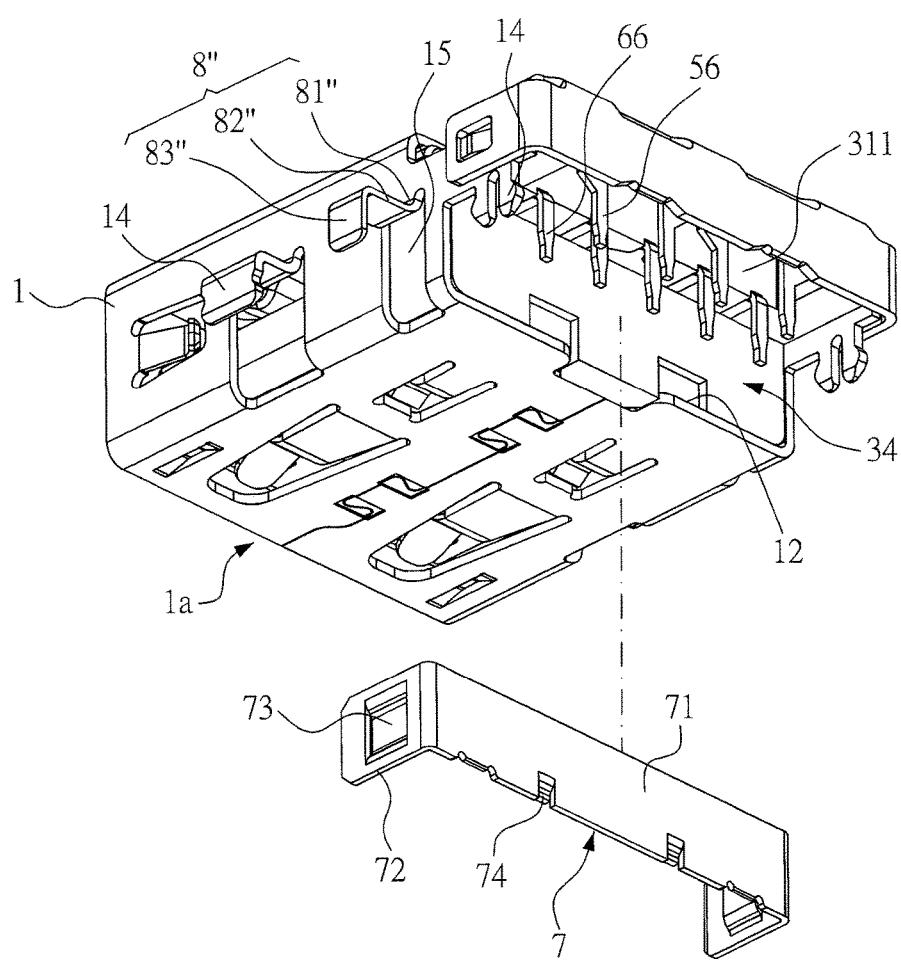
FIG. 7 illustrates a schematic exploded view showing a metallic shell of an electrical receptacle connector is to be assembled with a baffle plate, according to a second embodiment of the instant disclosure.
Figure 8:
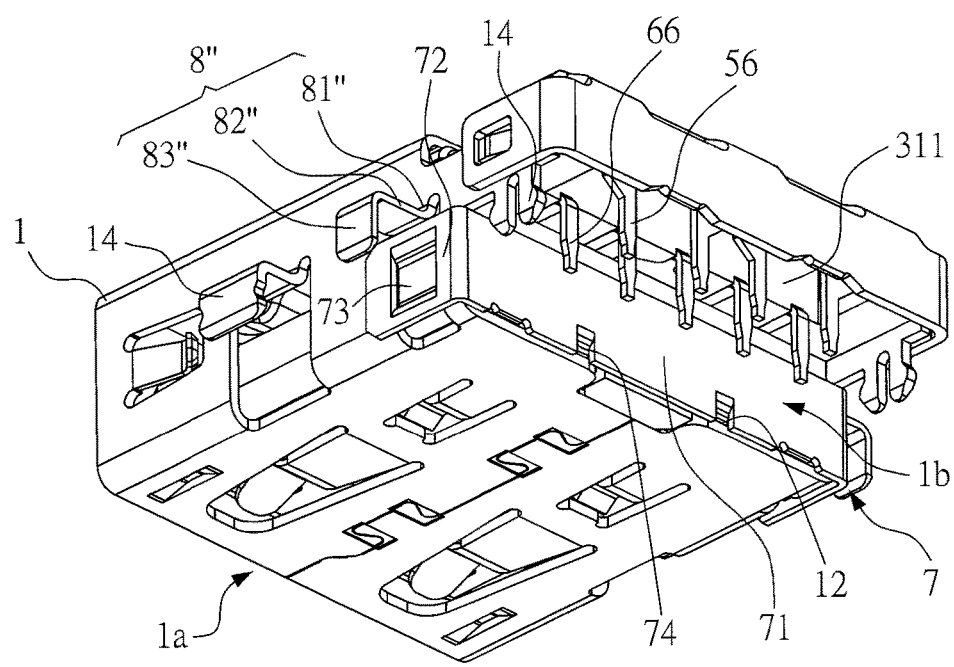
FIG. 8 illustrates a schematic perspective view showing the metallic shell of the connector is assembled with the baffle plate, according to the second embodiment.

Please refer to FIGS. 7 and 8, illustrating an electrical receptacle connector of a second embodiment of the instant disclosure. FIG. 7 illustrates a schematic exploded view showing a metallic shell of an electrical receptacle connector is to be assembled with a baffle plate, according to a second embodiment of the instant disclosure. FIG. 8 illustrates a schematic perspective view showing the metallic shell of the connector is assembled with the baffle plate, according to the second embodiment. In the first embodiment, the conductive ground legs 8' and the baffle plate 7 are an integral part. In this embodiment, the conductive ground legs 8" and the baffle plate 7 may be separated pieces, and the conductive ground legs 8" and the metallic shell 1 are an integral part. Each of the conductive ground legs 8" comprises a connection portion 81" and an extension portion 82". The connection portions 81" are respectively bent outwardly from the sidewalls 72. Each of the extension portions 82" extends outwardly from the corresponding connection portion 81". The conductive ground legs 8" extend outwardly from two sides of the rear portion of the metallic shell 1. In other words, in this embodiment, the conductive ground legs 8" are bent and extend from the two sides of the rear portion of the metallic shell 1, and the baffle plate 7 does not have the conductive ground legs and only has the main body 71 and the two sidewalls 72. The two sidewalls 72 are assembled below the conductive ground legs 8". In addition, the baffle plate 7 may be in contact with the conductive ground legs 8" via the two sidewalls 72 to guide the current, or the baffle plate 7 may be in contact with the metallic shell 1 via other portions of the baffle plate 7 to guide the current. Accordingly, the current flowing through the baffle plate 7 is guided to the circuit board 9 from the two sidewalls 72 to the conductive ground legs 8" (as shown in FIG. 6).

Please refer to FIGS. 7 and 8. In the second embodiment, the conductive ground legs 8" extend outwardly from the two sides of the rear portion of the metallic shell 1, and a recessed hole 15 is at a bottom portion of each of the conductive ground legs 8". In other words, as shown in FIGS. 7 and 8, two recessed holes 15 are formed on the two sides of the rear portion of the metallic shell 1. When the baffle plate 7 is assembled to the rear portion of the metallic shell 1, the two sidewalls 72 are at bottom portions of the conductive ground legs 8" to shield the two recessed holes 15, respectively.

Please refer to FIGS. 7 and 8. In the second embodiment, the conductive ground legs 8" further comprise an insertion leg 83". Each of the insertion legs 83" extends outwardly from an edge of the corresponding extension portion 82". The insertion legs 83" extend vertically and downwardly to form vertical legs (legs manufactured by through-hole technologies) and are in contact with the contact pads 91 of the circuit board 9 (as shown in FIG. 5). In other words, the insertion legs 83" are inserted into soldering holes of the circuit board 9 for soldering. In this embodiment, the baffle plate 7 comprises a plurality of bending sheets 74, and the bending sheets 74 are formed at the two sides of the main body 71 and engaged with the rear periphery 12 of the metallic shell 1. Accordingly, when the baffle plate 7 is assembled to the rear portion of the metallic shell 1 in a bottom-to-top direction, the bending sheets 74 are engaged with the lower surface of the rear periphery 12 of the metallic shell 1, so that up-and-down movement of the baffle plate 7 at the rear portion of the metallic shell 1 is limited.

Figure 9:
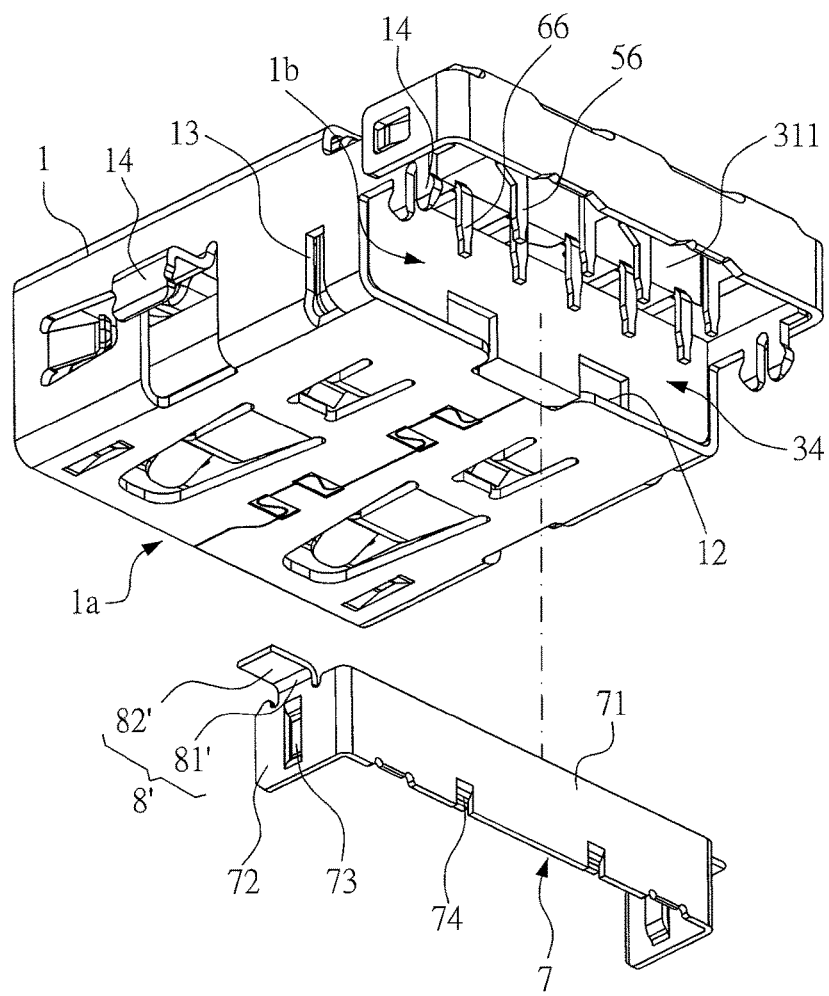
FIG. 9 illustrates a schematic exploded view showing a metallic shell of an electrical receptacle connector is to be assembled with a baffle plate, according to a third embodiment of the instant disclosure.
Figure 10:
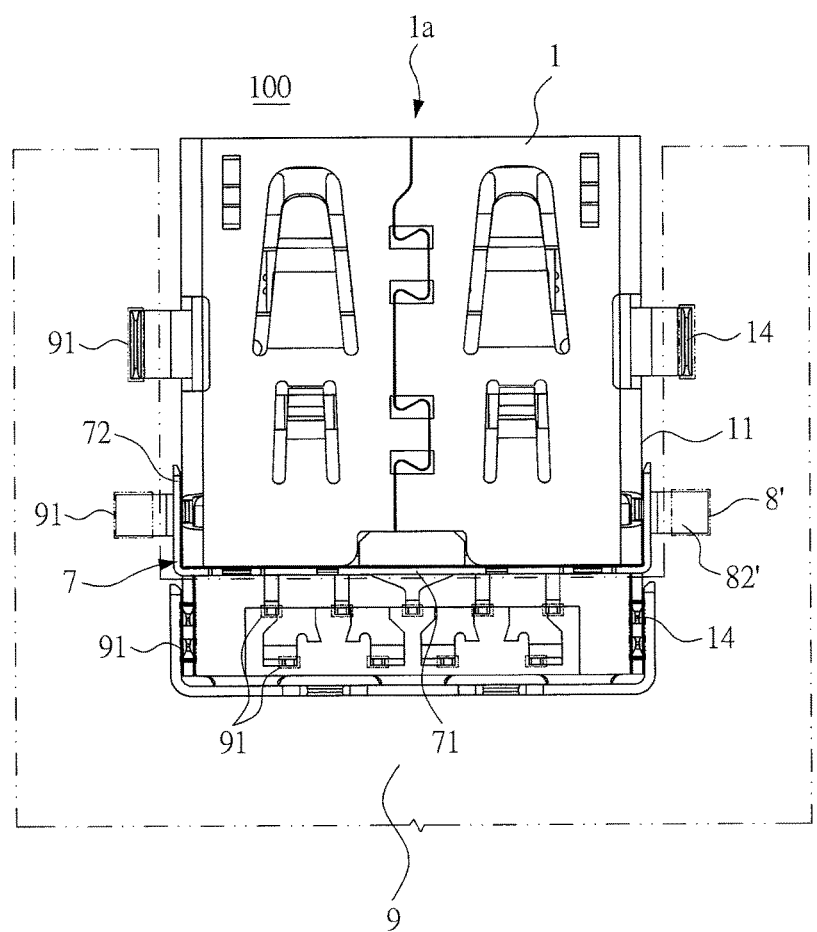
FIG. 10 illustrates a top view of the electrical receptacle connector of the third embodiment.

Please refer to FIGS. 9 and 10, illustrating an electrical receptacle connector of a third embodiment of the instant disclosure. FIG. 9 illustrates a schematic exploded view showing a metallic shell of an electrical receptacle connector is to be assembled with a baffle plate, according to a third embodiment of the instant disclosure. FIG. 10 illustrates a top view of the electrical receptacle connector of the third embodiment. In the first embodiment, the insertion legs of the conductive ground legs are vertical legs and in contact with the circuit board. In the third embodiment, the conductive ground leg does not have the insertion leg. Instead, the extension portions of the conductive ground legs are horizontal legs, i.e., legs manufactured by surface mount technology, and in contact with the contact pads of the circuit board. In other words, the extension portions are placed on the pad of the circuit board, in contact with the solder, and conducted with the circuit board by high-temperature melting. In addition, the extension portions may be adapted to ground. It is understood that, in the second embodiment, the extension portions may also be horizontal legs.

As above, the baffle plate is at the rear portion of the metallic shell, and the conductive ground legs are at two sides of the metallic shell. Therefore, during the electrical receptacle connector transmits data, the noise produced by the data are shielded by the baffle plate, and the noise current formed by the noise is guided to the circuit board through the conductive ground legs being in contact with the circuit board, thus the noises are grounded and diminished. The conductive ground legs are adjacent to the baffle plate; that is, the conductive ground legs are at the two sides of the rear portion of the metallic shell and in contact with the sidewalls of the baffle plate. Hence, the current flowing through the baffle plate is guided to the circuit board through the conductive ground legs, which has a shorter current path. Therefore, the noise current would not have an antenna effect easily on the transmission path. Accordingly, the noise spreading can be reduced, and the problems of the electromagnetic interference (EMI) and the radiofrequency interference (RFI) can be improved.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electrical receptacle connector, comprising:
   a metallic shell comprising a receptacle cavity, a front end at a front portion of the receptacle cavity, and a rear end at a rear portion of the receptacle cavity;
   a terminal module in the receptacle cavity, wherein the terminal module comprises a base portion at the rear end, a tongue portion outwardly extended from one side of the base portion toward the front end, and a plurality of first and second terminals at the base portion, one of two ends of each of the first terminals and one of two ends of each of the second terminals are exposed from a surface of the tongue portion, and the other end of each of the first terminals and the other end of each of the second terminals are protruded out of the base portion;
   a baffle plate at the rear end, wherein the baffle plate comprises a main body and two sidewalls, the main body is flush with a rear lateral surface of the base portion and in contact with a rear periphery of the metallic shell, the two sidewalls respectively extend from two sides of the main body toward two outer surfaces of two sides of the metallic shell; and
   a plurality of conductive ground legs adjacent to two sides of the rear portion of the metallic shell and respectively corresponding to the sidewalls, wherein each of the conductive ground legs comprises a connection portion and an extension portion, the connection portions are respectively in contact with the sidewalls, each of the extension portions extends outwardly from the corresponding connection portion.

2. The electrical receptacle connector according to claim 1, wherein each of the conductive ground legs and the baffle plate are an integral part, and each of the conductive ground legs extends outwardly from an edge of the corresponding sidewall.

3. The electrical receptacle connector according to claim 2, wherein each of the conductive ground legs comprises an insertion leg, each of the insertion legs extends outwardly from an edge of the corresponding extension portion.

4. The electrical receptacle connector according to claim 2, wherein the baffle plate comprises a plurality of protruding blocks, the protruding blocks are respectively formed in inner surfaces of the sidewalls, a plurality of engaging grooves is respectively formed on the two outer surfaces of the metallic shell for being engaged with the protruding blocks.

5. The electrical receptacle connector according to claim 1, wherein a plurality of extension legs extends outwardly from the two sides of the metallic shell, the extension legs are soldered with contact pads of a circuit board.

6. The electrical receptacle connector according to claim 1, wherein the baffle plate comprises a plurality of bending sheets, the bending sheets are formed at the two sides of the main body and engaged with the rear periphery of the metallic shell.

7. The electrical receptacle connector according to claim 1, wherein each of the conductive ground legs and the metallic shell are an integral part, and the conductive ground legs extend outwardly from two sides of the rear portion of the metallic shell.

8. The electrical receptacle connector according to claim 7, wherein each of the conductive ground legs comprises an insertion leg, each of the insertion legs extends outwardly from an edge of the corresponding extension portion.

9. The electrical receptacle connector according to claim 7, wherein two recessed holes are formed on the two sides of the rear portion of the metallic shell, the two sidewalls are at bottom portions of the conductive ground legs to shield the two recessed holes, respectively.

10. The electrical receptacle connector according to claim 7, wherein the baffle plate comprises a plurality of bending sheets, the bending sheets are formed at the two sides of the main body and engaged with the rear periphery of the metallic shell.

11. The electrical receptacle connector according to claim 1, wherein a terminal organizer is at the rear portion of the base portion and extends outwardly and a soldering region is at a bottom portion of the terminal organizer, the other end of each of the first terminals and the other end of each of the second terminals protrude out of the bottom portion of the terminal organizer.

12. The electrical receptacle connector according to claim 1, wherein each of the first terminals is held in the base portion and the tongue portion and disposed at an upper surface of the tongue portion, each of the second terminals is held in the base portion and the tongue portion and disposed at the upper surface of the tongue portion, the one of two ends of each of the second terminals is in front of the one of two ends of each of the first terminals.

* * * * *